United States Patent [19]

Tsumura

[11] Patent Number: 5,124,277
[45] Date of Patent: Jun. 23, 1992

[54] METHOD OF BALL BONDING TO NON-WIRE BONDED ELECTRODES OF SEMICONDUCTOR DEVICES

[75] Inventor: Kiyoaki Tsumura, Itami, Japan

[73] Assignee: Mitsubishi Denki Kabushiki Kaisha, Japan

[21] Appl. No.: 639,237

[22] Filed: Jan. 9, 1991

[30] Foreign Application Priority Data

Jan. 10, 1990 [JP] Japan .................. 2-1466

[51] Int. Cl.$^5$ .................. H01L 21/283
[52] U.S. Cl. .................. 437/9; 437/183; 228/179; 228/904
[58] Field of Search .................. 437/209, 9, 183; 228/179, 904, 4, 5

[56] References Cited

U.S. PATENT DOCUMENTS

| | | | |
|---|---|---|---|
| 4,442,967 | 3/1984 | Vander Pas et al. | 228/179 |
| 4,661,192 | 4/1987 | McShane | 29/827 |

FOREIGN PATENT DOCUMENTS

| | | | |
|---|---|---|---|
| 55-118643 | 11/1980 | Japan | 228/179 |
| 56-7442 | 1/1981 | Japan | 228/904 |
| 59-208751 | 11/1984 | Japan | 437/183 |
| 60-194543 | 10/1985 | Japan | 437/183 |
| 60-245239 | 12/1985 | Japan | 437/183 |
| 61-23329 | 1/1986 | Japan | 437/183 |
| 61-46036 | 3/1986 | Japan | 437/183 |
| 61-219159 | 9/1986 | Japan | 437/183 |
| 61-242045 | 10/1986 | Japan | 437/183 |
| 62-132350 | 6/1987 | Japan | 437/183 |
| 62-152142 | 7/1987 | Japan | 437/183 |
| 62-152143 | 7/1987 | Japan | 437/183 |
| 62-206857 | 9/1987 | Japan | 437/183 |
| 62-211937 | 9/1987 | Japan | 437/183 |
| 62-248240 | 10/1987 | Japan | 437/183 |
| 63-104431 | 5/1988 | Japan | 437/183 |
| 63-122133 | 5/1988 | Japan | 437/183 |
| 63-153832 | 6/1988 | Japan | 228/904 |
| 63-173345 | 7/1988 | Japan | 437/183 |
| 63-255928 | 10/1988 | Japan | 437/183 |
| 1-12555 | 1/1989 | Japan | 437/183 |
| 1-24435 | 1/1989 | Japan | 437/183 |
| 1-202830 | 8/1989 | Japan | 437/183 |
| 1-227458 | 9/1989 | Japan | 437/183 |
| 1-256154 | 10/1989 | Japan | 437/183 |
| 1-286450 | 11/1989 | Japan | 437/183 |

Primary Examiner—Olik Chaudhuri
Assistant Examiner—David E. Graybill
Attorney, Agent, or Firm—Leydig, Voit & Mayer

[57] ABSTRACT

In an internal wire bonding section of a semiconductor device, electrodes pads (e.g., Al pads) which are not connected to leads are ball-bonded with metallic balls (e.g., Au balls) to improve moisture resistance and to thereby reduce the rate of corrosion of internal portions of the semiconductor device. The operation of the semiconductor device manufacturing apparatus for ball bonding conforms to the conventional wire bonding operation, so that the existing process can be used without significantly improving the apparatus or significantly changing the semiconductor manufacturing method.

1 Claim, 6 Drawing Sheets

METHOD OF BALL BONDING TO NON-WIRE BONDED ELECTRODES OF SEMICONDUCTOR DEVICES

BACKGROUND OF THE INVENTION

1. Field of the Invention

This invention relates to a semiconductor device and a method of manufacturing the same in which electrode pads which are not connected by wires to leads are ball-bonded.

2. Description of the Related Art

FIG. 5 is a perspective view of a resin molded semiconductor device of, for example, a DIP (dual inline package) type. In this DIP type semiconductor device 100, outer leads portions 6b of leads 6 extend from two side surfaces of a resin molded portion 10. As shown in FIG. 6, a silicon (Si) substrate 1 of a semiconductor chip that is molded in the resin molded portion 10, has inner lead portions 6a of the leads 6 formed continuously with the outer leads 6b extend in the resin molded portion 10 to a position in the vicinity of the silicon (Si) substrate 1. Electrode pads 3 provided on the major surface of the Si substrate 1 and the inner lead portions 6a of the leads 6 are connected by thin wires 40. The Si substrate 1 is die-bonded (fixed) to a die pad 2. An electric circuit (not specifically illustrated) is formed by patterning on the major surface of the Si substrate 1. An internal wiring is provided by using aluminum (Al) members, and aluminum (Al) pads 3, i.e., the electrode pads for exchange of electrical signals between the Si substrate 1 and the outside are provided. The Al pads 3 are electrically connected to the inner lead portions 6a of the leads 6 by thin wires, e.g., gold (Au) wires 40. Au balls 41 are formed on the extreme ends of the Au wires 40 on the Al pad 3 side. The Au balls 41 are press-bonded to the Al pads 3. The ends of the Au wires 40 on the inner lead 6a side are bonded to the inner lead portions 6a by being simply pressed against the same. FIG. 6A shows a bonded state of each Au wire 40 in section. All the Si substrate 1, the die pad 2, the Au wires 40 and the inner lead portions 6a of the leads 6 are resin-molded in the resin molded portion 10 after wire bonding, as shown in FIG. 5. To minimize the influence of stresses applied from the resin as well as the influence of chemical substances, the surface of the Si substrate 1 is entirely coated with glass ($SiO_2$ film) 1a, except for the Al pads 3.

Next, a method of manufacturing the conventional semiconductor device will be described below with reference to FIGS. 7(a) to 7(e) which shows steps of a wire bonding process in which the Al pads on the Si substrate 1 and the inner lead portions 6a are connected by using an Au wire material 4 (hereinafter referred to simply as "Au wire").

First, as shown in FIG. 7(a), an Au wire 4 passing through a capillary tip 7 has an Au ball 41 formed at its extreme end. A clamper 9 provided above the capillary tip 7 is operated to clamp the Au wire 4 and is moved downward together with the capillary tip 7 so that the Au ball 41 is moved downward to the selected one of the Al pads 3 on the Si substrate 1 fixed on the die pad 2 by a die bonding agent 5. At this time, the die pad 2 and the inner lead portions 6a are fixed on a heat block (not shown) and are heated to 250° to 300° C. Next, as shown in FIG. 7(b) (in which the clamper is not shown), the capillary tip 7 is operated to impose a load of 50 to 60 g upon the Au ball 41 on the Al pad 3 while applying ultrasonic vibration thereto so that the Au ball 41 is plastically deformed and press-bonded to the Al pad 3. Next, the clamper 9 is opened to release the press-bonded Au ball 41 and is moved upward together with the capillary tip 7. As shown in FIG. 7(c), Au wire 4 is thereby paid out from the end of the capillary tip 7. The clamper 9 and the capillary tip 7 are further moved toward the inner lead 6a. As shown in FIG. 7(d), a load of 50 to 60 g and ultrasonic vibration are applied to the Au wire on inner lead 6a by the capillary tip 7, thereby press-bonding the inner lead 6a and the Au wire 4. At this time, no Au ball is formed. Thereafter, as shown in FIG. 7(e), the clamper (not shown) is operated to clamp the Au wire 4 and is, in this state, moved upward together with the capillary tip 7 to break the Au wire 4, thereby forming the Au wire 40. A high voltage (about 2,000 volts) is applied between the Au wire 4 thereby formed and a torch rod 8 to effect an electric discharge therebetween so that the Au wire 4 is melted, thereby forming a new Au ball 41.

By repeating this process, the Al pads on the Si substrate and the inner leads can be connected by Au wires as desired. The Al pads on the Si substrate and the inner leads are not connected in a one-to-one relationship by wires some of the Al pads may not have a wire-bonded connection. In particular, pads are often left without a wire-bonded connection in some types of ASICs (application specific ICs) which have recently been in demand, for example, those in which the number of I/O ports is selected by wire bonding connections (that is, of the pads provided, only necessary ones are bonded), or in DRAMs (dynamic RAM) or the like in which Al pads to be wire-bonded are changed according to the use of the semiconductor device (that is, a plurality of arrays of pads are provided and electrode pads of some of the pad arrays disposed at suitable positions according to use are selectively used).

A moisture resistance test of a type of a conventional semiconductor device having Al pads not having a wire-bonded connection has revealed that this type of device deteriorates faster than the type in which all Al pads are wire-bonded. FIG. 8 shows the vicinity of Al pads of the type of semiconductor device having a pad without a wire bond before the moisture resistance test, and FIG. 9 shows the vicinity of the Al pads observed by opening the molded resin of the semiconductor element deteriorated by the moisture resistance test. As shown in FIG. 9, corroded portion 11 of the Al pads extends from an Al pad 3a which is not wire-bonded to an internal portion of an Al wiring 12 connected to this pad. It is considered that this corrosion is caused by impurities in the resin (e.g., chlorine) and by water permeating from the outside, and that in the case of the Al pad without a wire bond, the non-bonded opening area is so large that the corresponding Al pad portion is corroded and forms large amounts of corrosion products which attack the internal Al wiring. In particular, the above-mentioned ASICs and DRAMs have very thin wiring (1.0 to 0.8 $\mu$m) and the corrosion speed is high. The conventional semiconductor devices entail these drawbacks.

SUMMARY OF THE INVENTION

Accordingly, in view of the above-described problems, an object of the present invention is to provide a semiconductor device improved in moisture resistance by a simple countermeasure as well as a method of manufacturing this semiconductor device.

In order to achieve this object, according to one aspect of the present invention, there is provided a semiconductor device comprising: a silicon substrate having a plurality of electrode pads provided on its major surface on which a desired circuit is formed, and on which internal wiring is provided; a die pad for supporting the silicon substrate on which the silicon substrate is mounted; a plurality of leads each extending outward from a position in the vicinity of the silicon substrate, each of the leads having an inner lead portion closer to the silicon substrate and an outer lead portion extending outward from the silicon substrate; a plurality of thin wires connecting selected electrode pads provided on the major surface of the silicon substrate to selected inner lead portions of the plurality of leads, respectively; a metallic ball being formed on an end of each thin wire bonded to an electrode pad; a metallic ball being disposed on at least one electrode pad provided on the major surface of the silicon substrate not connected by a wire to an inner lead to at least one of the electrode pads; an insulating layer covering the whole of the major surface of the silicon substrate except for the portions on which the plurality of electrode pads are provided; and a molded portion in which the components of the semiconductor device other than at least the outer lead portions of the leads are molded.

According to another aspect of the present invention, there is provided a method of manufacturing a semiconductor device in which a semiconductor substrate, including a plurality of electrode pads provided on a major surface, is diebonded to a die pad at least one of the electrode pads not connected by a metallic wire to an inner lead including a) forming a metallic ball on an end of a thin wire passing through a capillary tip by applying a high voltage between the thin wire end and a torch rod so as to cause an electric discharge; b) press-bonding the metallic ball to an electrode pad not connected to an inner lead by clamping the thin wire with a clamper disposed opposite the capillary tip from the substrate, by moving the capillary tip and the clamper so that the metallic ball is moved to the selected electrode pad not connected to any of the inner lead portions, and by applying a load and ultrasonic vibration from the capillary tip so that the metallic ball is connected to the electrode pad while the electrode pad is plastically deformed; and c) lifting the thin wire from the metallic ball while clamping the thin wire with the clamper to break the thin wire connected to the metallic ball.

According to the present invention, Al pads which are not wire bonded are ball-bonded by forming Au balls. Accordingly, the amount of the opening non-bonded area of the Al pads, which is not covered with the Al ball, is thereby reduced so that the possibility of contact of internal portions with corrosive substances (impurities in the molding resin and water) is small.

DESCRIPTION OF THE PREFERRED EMBODIMENT

Figure 1:
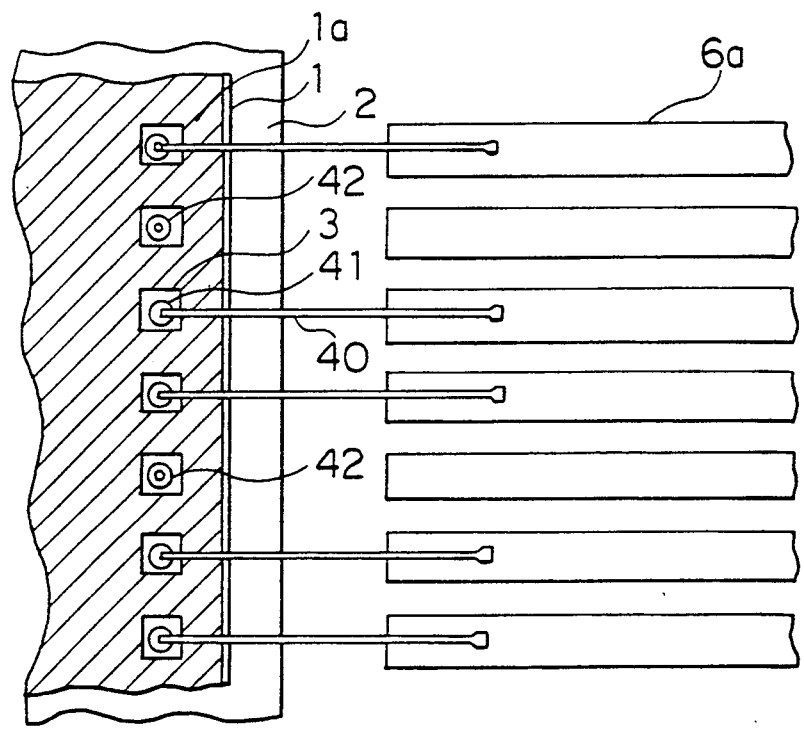
FIG. 1 is an enlarged plan view of an internal wire-bonded portion of a semiconductor device in accordance with an embodiment of the present invention.

An embodiment of the present invention will be described below with reference to the accompanying drawings. FIG. 1 is an enlarged plan view of a semiconductor chip and leads in accordance with an embodiment of the present invention, showing connected portions thereof after a wire bonding process. In FIG. 1, portions or components identical or corresponding to those of the conventional device are indicated by the same reference characters. As illustrated, Au balls 42 are also press-bonded to Al pads which are not wire-bonded by using Au wires 40. Steps of a ball bonding process in accordance with the present invention will be described below with reference to FIGS. 2(a) to 2(e).

Figure 2A:
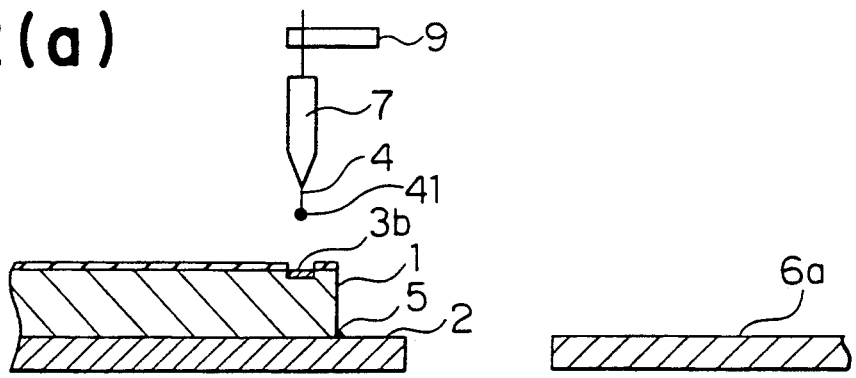
FIGS. 2(a) to 2(e) are diagrams of a ball bonding process in accordance with a semiconductor manufacturing method in accordance with the present invention.
Figure 2B:
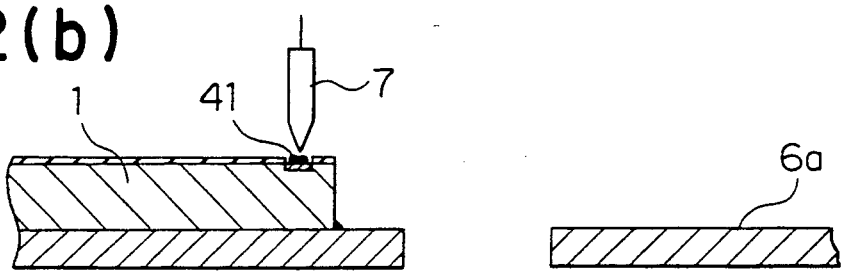
Figure 2C:
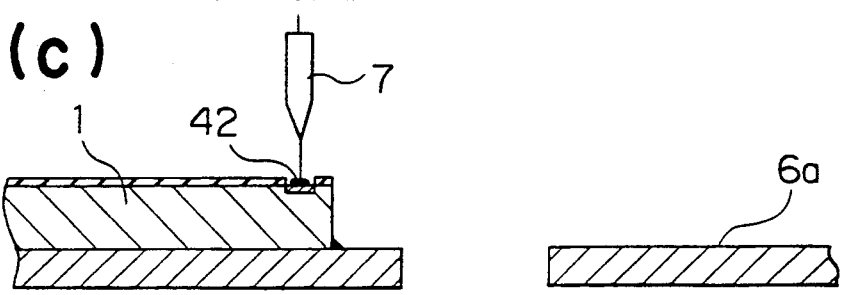
Figure 2D:
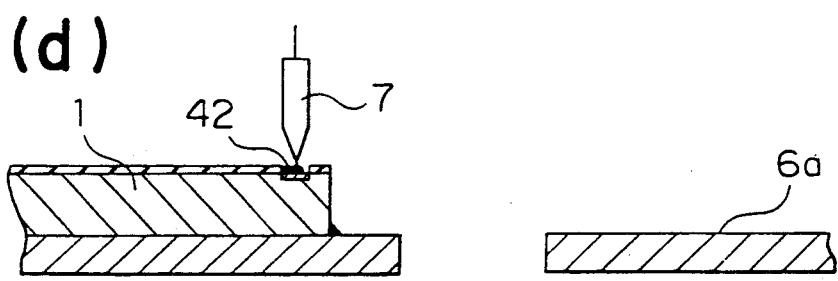
Figure 2E:
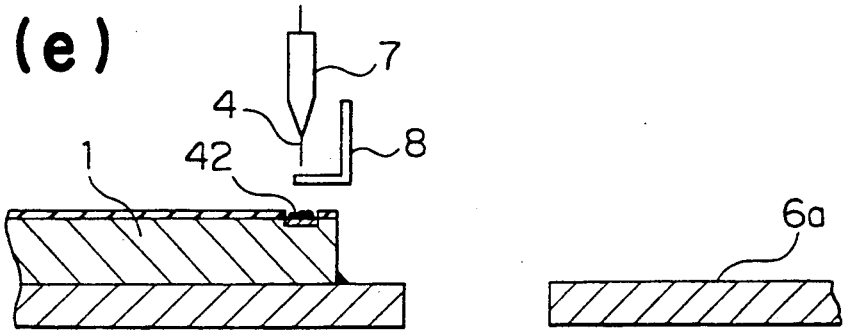

First, as shown in FIG. 2(a), an Au wire material 4 passing through a capillary tip 7 has an Au ball 41 formed at its extreme end. A clamper 9 provided above the capillary tip 7 is operated to clamp the Au wire 4 and is moved downward together with the capillary tip 7 so that the Au ball 41 is moved downward to an Al pad 3b on the Si substrate 1 fixed on the die pad 2, which Al pad 3b is to be ball-bonded. At this time, the die pad 2 and the inner leads 6a are fixed on a heat block (not shown) and are heated to 250° to 300° C. Next, as shown in FIG. 2(b), a load of 50 to 60 g and ultrasonic vibration are applied by the capillary tip 7 so that the Au ball 41 is plastically deformed and is press-bonded to the Al pad 3(b). Next, as shown in FIG. 2(c), the clamper 9 is opened to release the press-bonded Au ball 42 and is moved upward together with the capillary tip 7. The Au wire 4 is thereby paid out from the end of the capillary tip 7. The clamper 9 in the opened state and the capillary tip 7 are again moved vertically downward until the capillary tip 7 is brought into contact with the press-bonded Au ball 42, as shown in FIG. 2(d). At this time, no load nor ultrasonic waves are applied. Thereafter, as shown in FIG. 2(e), the capillary tip 7 and the clamper 9 are moved upward while the clamper 9 is clamping the Au wire 4, thereby breaking the Au wire 4. A high-voltage is applied to effect an electric discharge between an end of the Au wire 4 thereby formed and the torch rod 8. The Au wire 4 is thereby melted so that a new Au ball 41 is formed.

Figure 3:
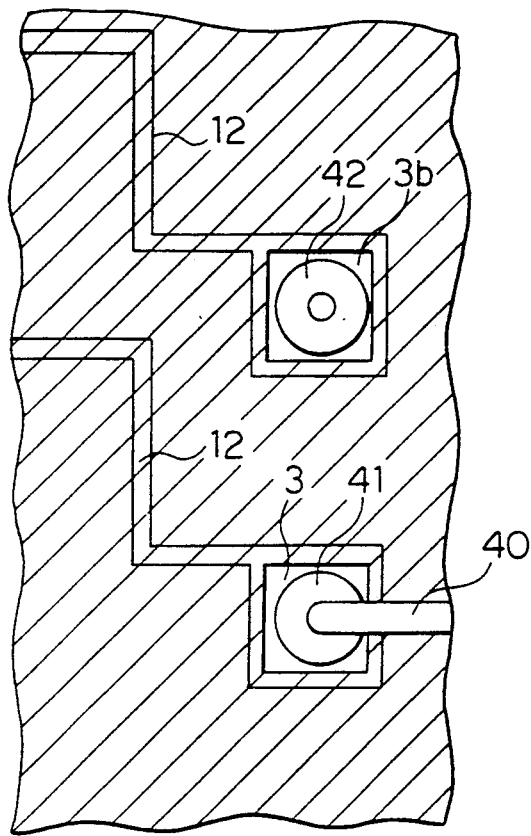
FIG. 3 is an enlarged plan view of the vicinity of a ball-bonded electrode pad after a moisture resistance test.
Figure 9:
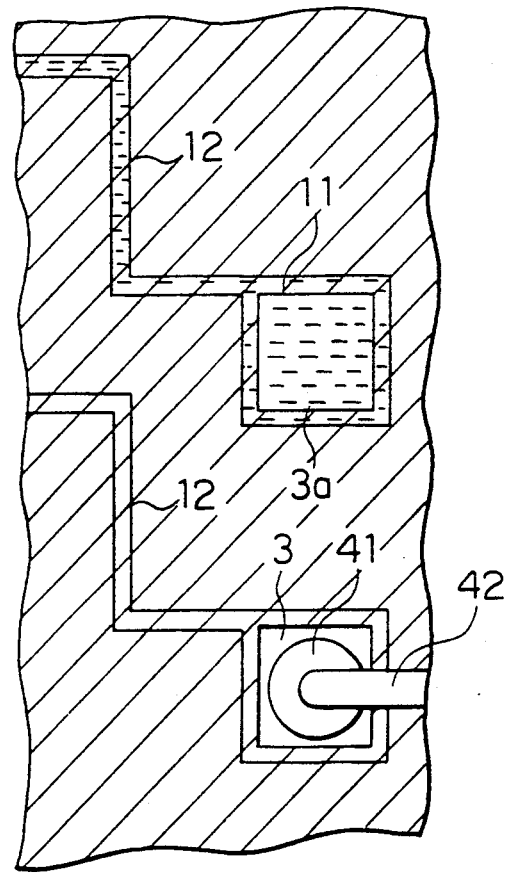
FIG. 9 is an enlarged plan view of the vicinity of the non-wire-bonded Al pad after the moisture resistance test.

According to the present invention, as described above, electrode pads on the Si substrate which are not wire-bonded are ball-bonded. A moisture resistance test conducted under the same conditions as the test relating to FIG. 9 produced no substantial corrosion of the electrode pads and the Al wiring, as shown in the enlarged plan view of FIG. 3 with respect to a portion of the device in the vicinity of the Al pad 3b not wire-bonded.

Figure 4:
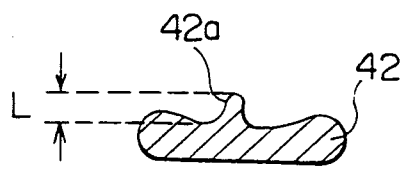
FIG. 4 is an enlarged cross-sectional view of a metallic ball formed by ball bonding.
Figure 5:
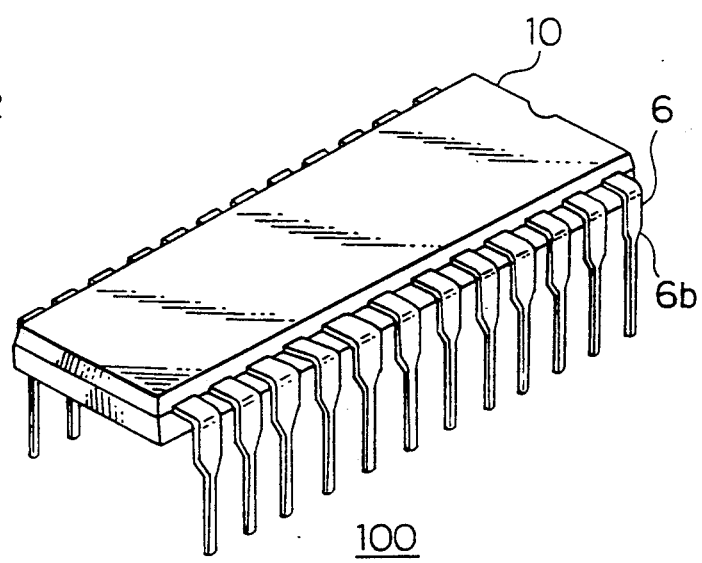
FIG. 5 is a perspective view of resin molded semiconductor device.
Figure 6:
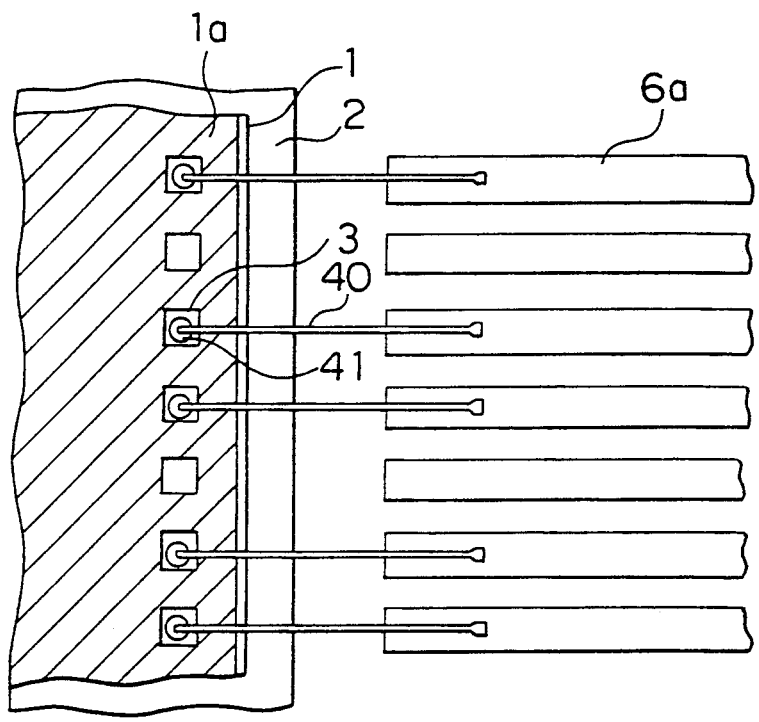
FIG. 6 is an enlarged plan view of an internal wire-bonded portion of a conventional semiconductor device.
Figure 6A:
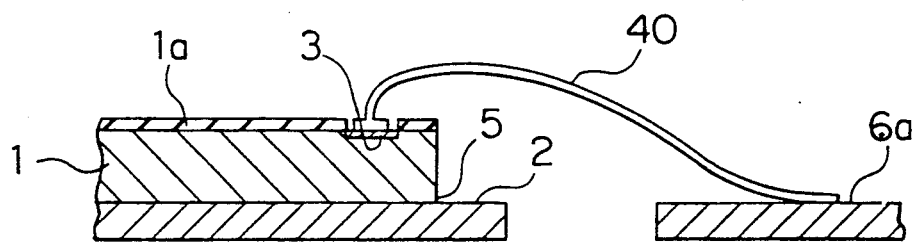
FIG. 6A is a cross-sectional view of the wire-bonded portion shown in FIG. 6.
Figure 7A:
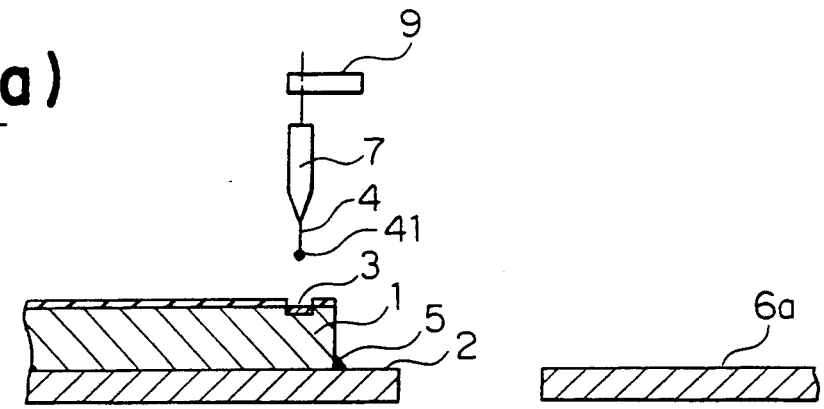
FIGS. 7(a) to 7(e) are diagrams of a conventional wire bonding process.
Figure 7B:
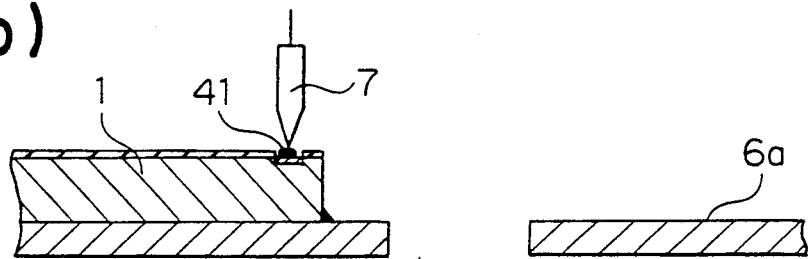
Figure 7C:
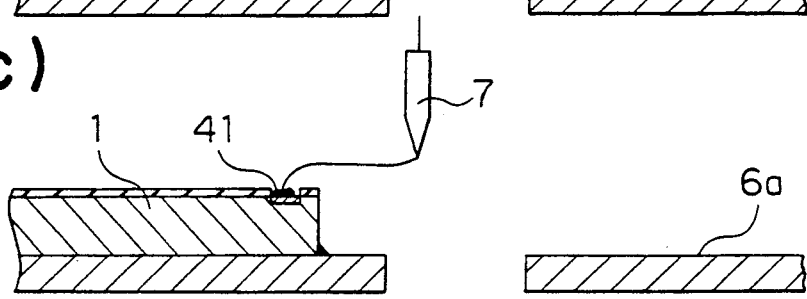
Figure 7D:
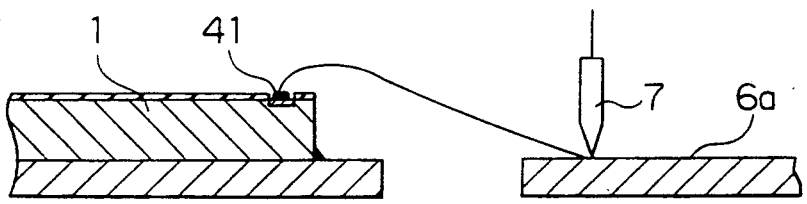
Figure 7E:
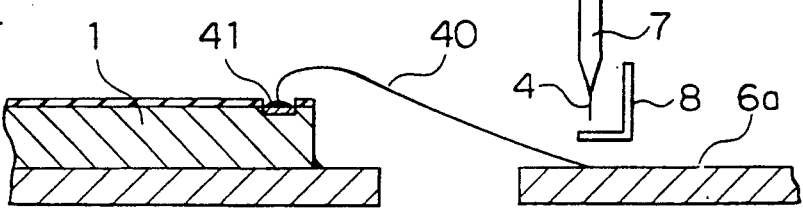
Figure 8:
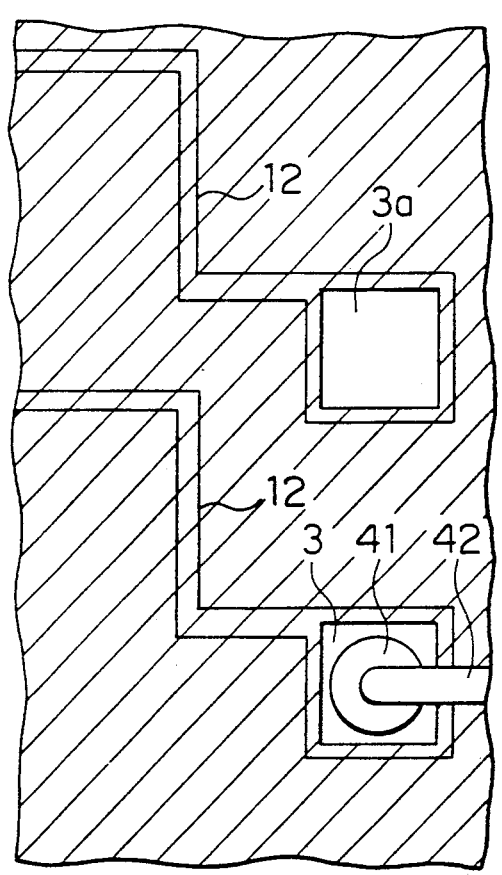
FIG. 8 is an enlarged plan view of a non-wire-bonded Al pad before the moisture resistance test.

In the embodiment described above with reference to FIGS. 2(a) to 2(e), the clamper and the capillary tip are simply moved in a vertical direction to descend and return one time in the steps shown in FIGS. 2(c) and 2(d). These steps are intended to conform the ball bonding operation of the clamper and the capillary tip to the conventional wire bonding operation so that the ball bonding process of the present invention can be carried out without any substantial change in the apparatus (not shown) for manufacturing the conventional semiconductor device. However, the steps shown in FIGS. 2(c) and 2(d) may be deleted to effect ball bonding in order of (a)→(b)→(e), thereby enabling ball bonding to be performed more speedily. As shown in the enlarged cross-sectional view of FIG. 4, there is a remaining wire portion 42a on the Au ball 42 formed by ball bonding, which portion is cut from the Au wire. If the length L of the remaining wire portion 42a is large, this portion may contact an adjacent electrode pad or Au wire to cause a malfunction of the device by short-circuit. The length L of the remaining wire portion 42a is therefore limited to the electrode pad disposition interval. Ordinarily, the electrode disposition interval is 100 to 120 μm, and the length L of the remaining wire portion 42a is set to 100 μm or less.

The Au wire may be replaced with a wire material including Ag, Cu, or Fe as a main component. If such a wire material is used, the Au ball formed at the wire end is an Au, Cu or Fe ball.

According to the present invention, as described above, electrodes pads (e.g., Al pads) which are not wire-bonded are ball-bonded with metallic balls (e.g., Au balls) to improve the moisture resistance, thereby reducing the rate of corrosion of internal portions of the semiconductor device. Also, the operation of the semiconductor device manufacture apparatus at the time of ball bonding is performed in conformity of the conventional wire bonding operation, thereby enabling the existing process to be used without significantly improving the apparatus or significantly changing the semiconductor manufacture method.

What is claimed is:

1. A method of manufacturing a semiconductor device including a plurality of electrode pads provided on a major surface of a silicon substrate die-bonded to a die pad comprising:
    (a) forming a metallic ball on an end of a thin wire passing through a capillary tip by applying a high voltage between said thin wire end and a torch rod to cause an electric discharge;
    (b) press-bonding the metallic ball to one of the electrode pads not to be connected by a wire to an inner lead by clamping the thin wire with a clamper disposed on the opposite side of the capillary tip from the substrate by moving the capillary tip and the clamper toward the silicon substrate so that the metallic ball is moved to a selected electrode pad not connected to an inner lead and by applying a force and ultrasonic vibration from the capillary tip to attach the metallic ball to the electrode pad;
    (c) releasing clamping of the thin wire by the clamper and moving the clamper in a reciprocating linear direction; and
    (d) moving the thin wire away from the metallic ball while clamping the thin wire with the clamper to break the thin wire connected to the metallic ball, leaving a portion of the thin wire attached to the metallic ball having a length no greater than 100 microns.

* * * * *